(12) United States Patent
Torrisi et al.

(10) Patent No.: US 11,342,908 B2
(45) Date of Patent: May 24, 2022

(54) METHOD OF OPERATING H-BRIDGE CIRCUITS AND CORRESPONDING DRIVER DEVICE

(71) Applicants: STMicroelectronics S.r.l., Agrate Brianza (IT); STMicroelectronics (Alps) SAS, Grenoble (FR)

(72) Inventors: Giovanni Luca Torrisi, Aci Catena (IT); Domenico aka Massimo Porto, Catania (IT); Christophe Roussel, Claix (FR)

(73) Assignees: STMicroelectronics S.r.l., Agrate Brianza (IT); STMicroelectronics (Alps) SAS, Grenoble (FR)

( * ) Notice: Subject to any disclaimer, the term of this patent is extended or adjusted under 35 U.S.C. 154(b) by 0 days.

(21) Appl. No.: 17/145,863

(22) Filed: Jan. 11, 2021

(65) Prior Publication Data

US 2021/0135661 A1 May 6, 2021

Related U.S. Application Data

(63) Continuation of application No. 16/849,020, filed on Apr. 15, 2020, now Pat. No. 10,924,100.

(30) Foreign Application Priority Data

Apr. 15, 2020 (IT) .......................... 102019000006078

(51) Int. Cl.
*H03K 17/00* (2006.01)
*H02P 7/03* (2016.01)

(52) U.S. Cl.
CPC ............. *H03K 17/002* (2013.01); *H02P 7/04* (2016.02)

(58) Field of Classification Search
None
See application file for complete search history.

(56) References Cited

U.S. PATENT DOCUMENTS

| | | | |
|---|---|---|---|
| 6,259,305 B1 * | 7/2001 | Pakriswamy | G11B 5/012 327/110 |
| 6,856,106 B2 * | 2/2005 | Bliley | H02P 5/68 318/111 |
| 8,724,353 B1 | 5/2014 | Giulliano et al. | |

(Continued)

FOREIGN PATENT DOCUMENTS

WO 2018024207 A1 2/2018

OTHER PUBLICATIONS

IT Search Report and Written Opinion for IT Appl. No. 102019000006078 dated Dec. 18, 2019 (8 pages).

*Primary Examiner* — Jeffery S Zweizig
(74) *Attorney, Agent, or Firm* — Crowe & Dunlevy

(57) ABSTRACT

An H-bridge circuit includes a supply voltage node, a first pair of transistors and a second pair of transistors. First transistors in each pair have the current paths therethrough included in current flow lines between the supply node and, respectively, a first output node and a second output node. Second transistors in each pair have the current paths therethrough coupled to a third output node and a fourth output node, respectively. The first and third output nodes are mutually isolated from each other and the second and fourth output nodes are mutually isolated from each other. The H-bridge circuit is operable in a selected one of a first, second and third mode.

8 Claims, 7 Drawing Sheets

(56) References Cited

U.S. PATENT DOCUMENTS

| | | |
|---|---|---|
| 9,595,947 B2 | 3/2017 | Poletto et al. |
| 10,122,349 B1 | 11/2018 | Der et al. |
| 2013/0033241 A1 | 2/2013 | Heo et al. |

* cited by examiner

METHOD OF OPERATING H-BRIDGE CIRCUITS AND CORRESPONDING DRIVER DEVICE

CROSS-REFERENCE TO RELATED APPLICATIONS

This application is a continuation of U.S. application patent Ser. No. 16/849,020 filed Apr. 15, 2020, which claims the priority benefit of Italian Application for Patent No. 102019000006078, filed on Apr. 18, 2019, the contents of which are hereby incorporated by reference in their entireties to the maximum extent allowable by law.

TECHNICAL FIELD

The description relates to driving H-bridge circuits.

One or more embodiments may be applied, for instance, to driving components for consumer electronics and industrial controls, as well as DC motor controls.

BACKGROUND

Various control circuits may be employed to drive bidirectional DC motors.

For instance, a motor can be driven via four MOSFET transistors in an H-bridge configuration, which is capable of switching the polarity of a signal applied to a load.

In order to provide a driver capable of operating in a manner independent from the type of load, H-bridge drivers may embed separate multiple intellectual properties (IPs) for each different application mode. In electronic design a semiconductor intellectual property core, IP core, or IP block is term of art which refers to a reusable unit of logic, cell, or integrated circuit (commonly called a "chip") layout design that is the intellectual property of one party.

A solution as discussed previously involves duplicating the internal circuitry. This represents an evident drawback in terms of die size (increasing area) and package (additional number of pins), resulting in undesirable for extra costs.

Embedding multiple IPs is thus an option difficult to envisage in the case of Standard Products (SPs), which are expected to be small and cheap in order to be attractive and competitive for the market.

There is accordingly a need in the art to contribute in providing such an improved solution.

SUMMARY

One or more embodiments may relate to a corresponding H-bridge circuit driver device.

A method of operating an H-bridge circuit in a plurality of modes may be exemplary of such a method.

One or more embodiments may comprise a flexibly suitable architecture to address a plurality of different applications.

One or more embodiments may comprise a related diagnosis structure working in all different conditions.

One or more embodiments may provide an independent driving of the external MOSFET transistors (e.g., in a so-called "Quad mode").

One or more embodiments may facilitate working with a single stage charge pump topology, reducing costs and optimizing price.

BRIEF DESCRIPTION OF THE DRAWINGS

One or more embodiments will now be described, by way of non-limiting example only, with reference to the annexed Figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

The drawings are in simplified form and are not to precise scale. For the sake of simplicity, directional (up/down, etc.) or motional (forward/back, etc.) terms may be used with respect to the drawings. The term "couple" and similar terms do not necessarily denote direct and immediate connections, but also include connections through intermediate elements or devices.

Figure 1:
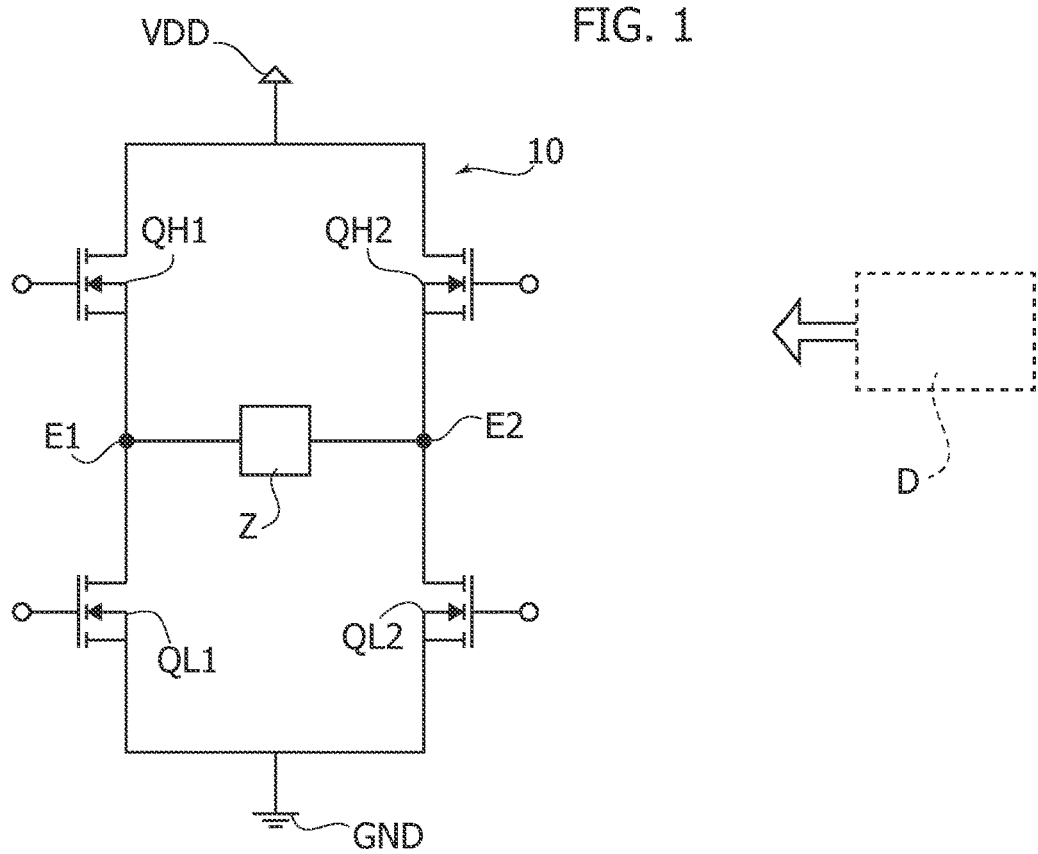
FIGS. 1 and 2 are exemplary of an H-bridge circuit.
Figure 2:
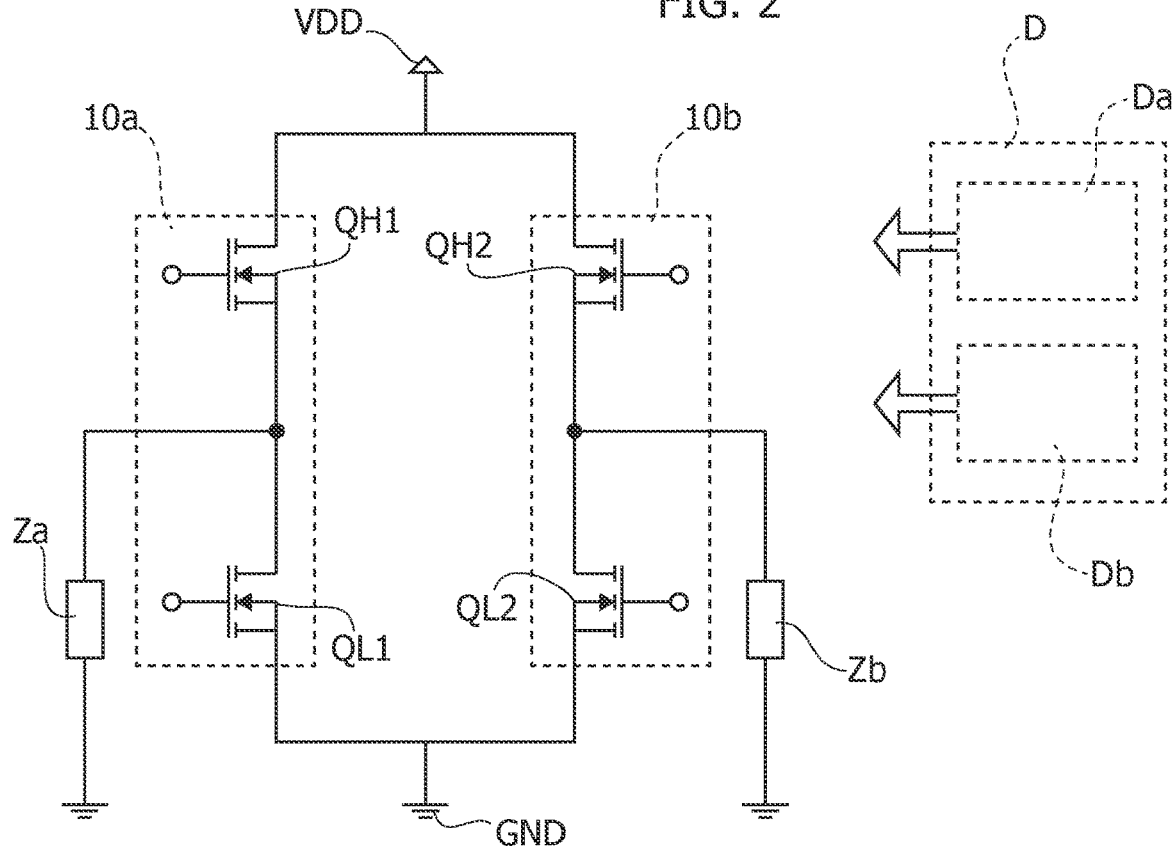

As exemplified in FIGS. 1 and 2, an H-bridge circuit 10 may include a supply node VDD, configured to be coupled to a supply voltage, e.g., a Direct Current (DC) source such as a battery or charge pump providing a voltage VDD, and source terminals of low side devices are connected to ground GND, as well as a first pair of "left branch" transistors QH1, QL1 of the bridge, e.g., MOSFET transistor devices, and a second pair of "right branch" transistors QH2, QL2 of the bridge, e.g., MOSFET transistors. Stated otherwise, an H-bridge circuit 10 may employ a pair of "high side" MOSFET transistor devices QH1, QH2 and a pair of "low side" MOSFET transistor devices QL1, QL2. An H-bridge 10 may be discussed as having a "left" branch and a "right" branch, each branch having a high side QH1, QH2 and a low side QL1, QL2 transistor, respectively.

In one or more embodiments, a pair of output terminals E1, E2 between current paths through left-side QH1, QL1 and right-side QH2, QL2 transistors may be configured to be connected to a load Z, e.g., a bidirectional motor load Z.

A control circuit D may be provided, configured to operate transistors (e.g., turn on/off) the high side QH1, QH2 and low side QL1, QL2 devices, so that transistors QH1, QH2, QL1, QL2 may be modeled as switches, in order to drive a current through the motor Z, e.g., through its windings in directions to cause rotation of the motor Z rotor in a clockwise or counterclockwise direction. For the sake of simplicity, the control circuit D electrical connections are represented by an arrow directed towards the H-bridge circuit 10.

If an application involves driving more than one load, it may be possible to use a "half-bridge", e.g., employing two transistors QH1, QL1 on one branch of the H-bridge 10, similar to class AB amplifier solutions.

For instance, as exemplified in FIG. 2, the half-bridge may be controlled via respective controllers Da, Db so as to drive two motor loads Za, Zb, wherein the H-bridge 10 may be viewed as comprising two parallel half-bridges 10a, 10b.

Existing H-bridge driver solutions do not offer full flexibility, as they may be capable to drive solely motor-type loads, e.g., using H-bridge or Half-bridge topologies.

In some cases, when driving loads Z, Za, Zb in a topology other than those provided by an H-Bridge operated in conventional manner is considered, integrated circuit (IC) drivers may facilitate driving half bridges independently, in a so called "Dual mode".

In certain cases, a same IC device may not be able to drive different applications in which external transistors QH1, QL1, QH2, QL2 could be configured in any chosen way, e.g., as high-side or low-side. For instance, a driver may not work independently of the type of the load.

Figure 3:
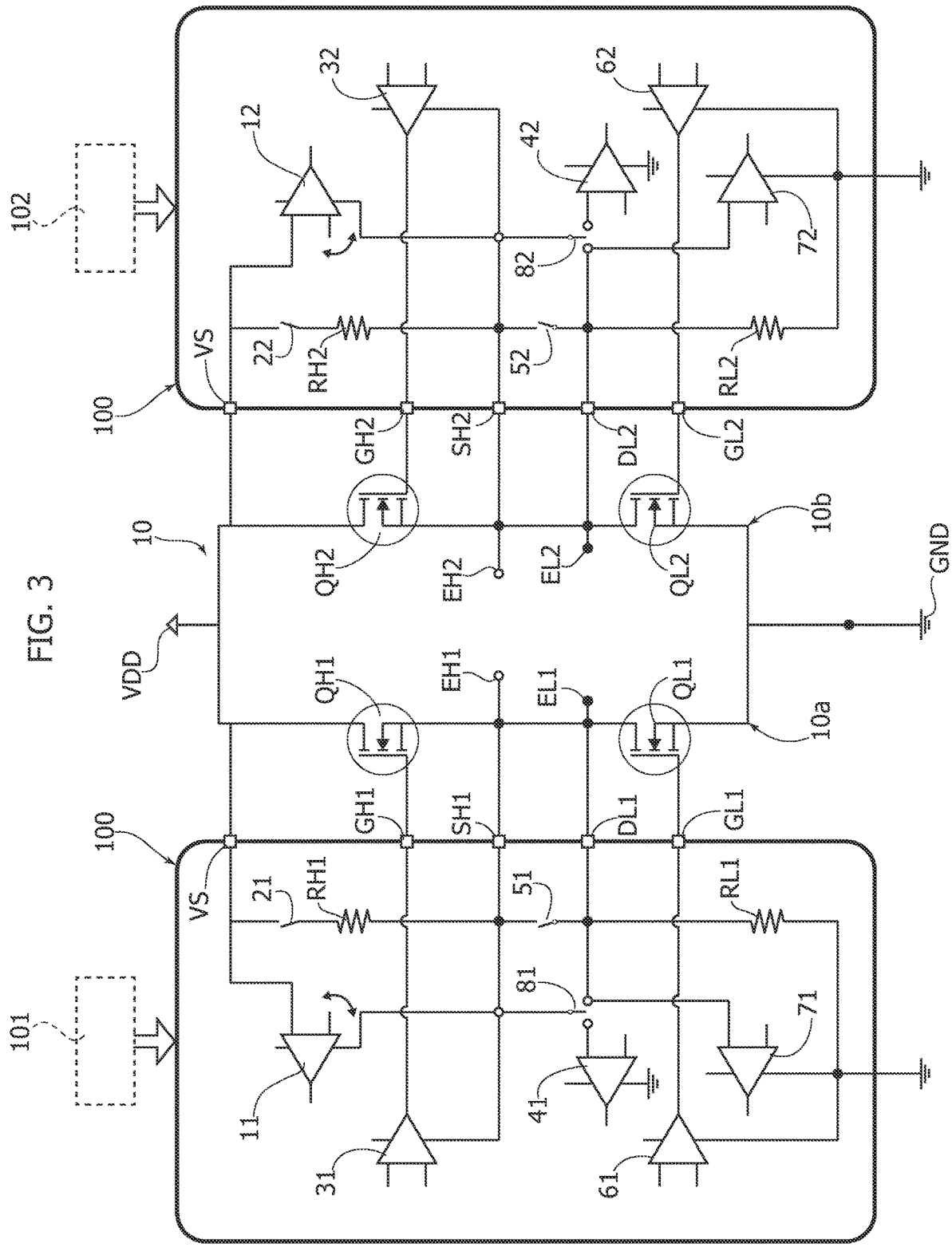
FIGS. 3 to 5 are diagrams exemplary of one or more embodiments of a method for driving an H-bridge circuit.

FIG. 3 represents a diagram of an H-bridge circuit driver device 100 which may comprise control logic circuitry portions 101, 102, e.g., a first portion 101 for driving the first pair of transistors QH1, QL1 in the "left" branch 10a of the H-bridge circuit 10 and a second portion 102 for driving the second pair of transistors QH2, QL2 in the "right" branch 10b of the H-bridge circuit 10.

In the following, for the sake of simplicity, components in the first portion 101 are mainly discussed. For the second circuit portion 102, like elements may be indicated as having like references, working for respective components on the respective "right" branch 102 of the H-bridge driver circuit 10.

In one or more embodiments, as exemplified in FIG. 3, an H-bridge circuit 10 may include a supply node configured to be coupled to a supply voltage VDD as well as a first "left branch" pair of transistors QH1, QL1 and a second "right branch" pair of transistors QH2, QL2, each pair of transistors including a first transistor QH1, QH2 and a second transistor QL1, QL2.

In one or more embodiments, the first transistors QH1, QH2 in the two pairs of transistors QH1, QL1 and QH2, QL2 may have the current paths therethrough included in respective current flow lines between the supply node VDD and a first output node EH1 and between the supply node VDD and a second output node EH2, respectively.

In one or more embodiments, the second transistors QL1, QL2 in respective "left" and "right" pairs of transistors QH1, QL1 and QH2, QL2 have the current paths therethrough coupled to a third output node EL1 and a fourth output node EL2, respectively.

In one or more embodiments (see, FIG. 5), the first output node EH1 and the third output node EL1 may be mutually isolated from each other, as well as the second output node EH2 and the fourth output node EL2 may be mutually isolated from each other.

As exemplified in FIG. 3, the logic control circuitry portion 101, 102 in the H-bridge driver circuit 100 may comprise:
a first pair GH1, GL1 and GH2, GL2 of transistor drive pins configured to be coupled to respective control terminals of the first pair of transistors QH1, QL1 and the second pair of transistors QH2, QL2 in the H-bridge circuit 10;
a first SH1 and second SH2 output node pins and a third DL1 and fourth DL2 output node pins configured to be coupled to a first EH1 and second EH2 and third EL1 and fourth EL2 output nodes, respectively;
at least one supply node pin VS;
logic control circuitry 101, 102 coupled to the first pair GH1, GL1 and second pair GH2, GL2 of transistor drive pins, the first SH1, second SH2, third DL1 and fourth DL2 output node pins and the at least one supply node pin VS.

In one or more embodiments, the logic control circuitry 101, 102 may be configured to operating said H-bridge circuit 10 in a selected one of a plurality of modes, the plurality of modes comprising a first, a second and a third mode.

In one or more embodiments, the H-bridge driver 100 may comprise:
a set of pairs of differential amplifiers 11, 12; 31, 32; 61, 62; 71, 72, e.g., two pairs of differential amplifiers for drain source monitoring (e.g., amplifiers 11, 12 and 61, 62) and/or open-load monitoring (e.g., amplifiers 31, 32 and 71, 72);
a set of pairs of pull-up resistors, e.g., two pairs of resistors RH1, RH2; RL1, RL2 for off-state diagnosis;
a pair of comparators 41, 42 configured to facilitate open-load monitoring independently of the first pair transistors QH1, QL1 in the left branch of the H-bridge 10 and of the second pair transistors QH2, QL2 in the right branch of the H-bridge 10, respectively;
a set of switch pairs, 21, 22; 51, 52; 81, 82 which may be operated via signals provided for respective control logic portions 101, 102 in the driver device 100 as discussed in the following.

In one or more embodiments, resistances in the set of resistances RH1, RL1 may have a same value, e.g., RH1=RL1=20 kOhm (1 kOhm=1 kiloOhm=$10^3$ Ohm).

Figure 4:
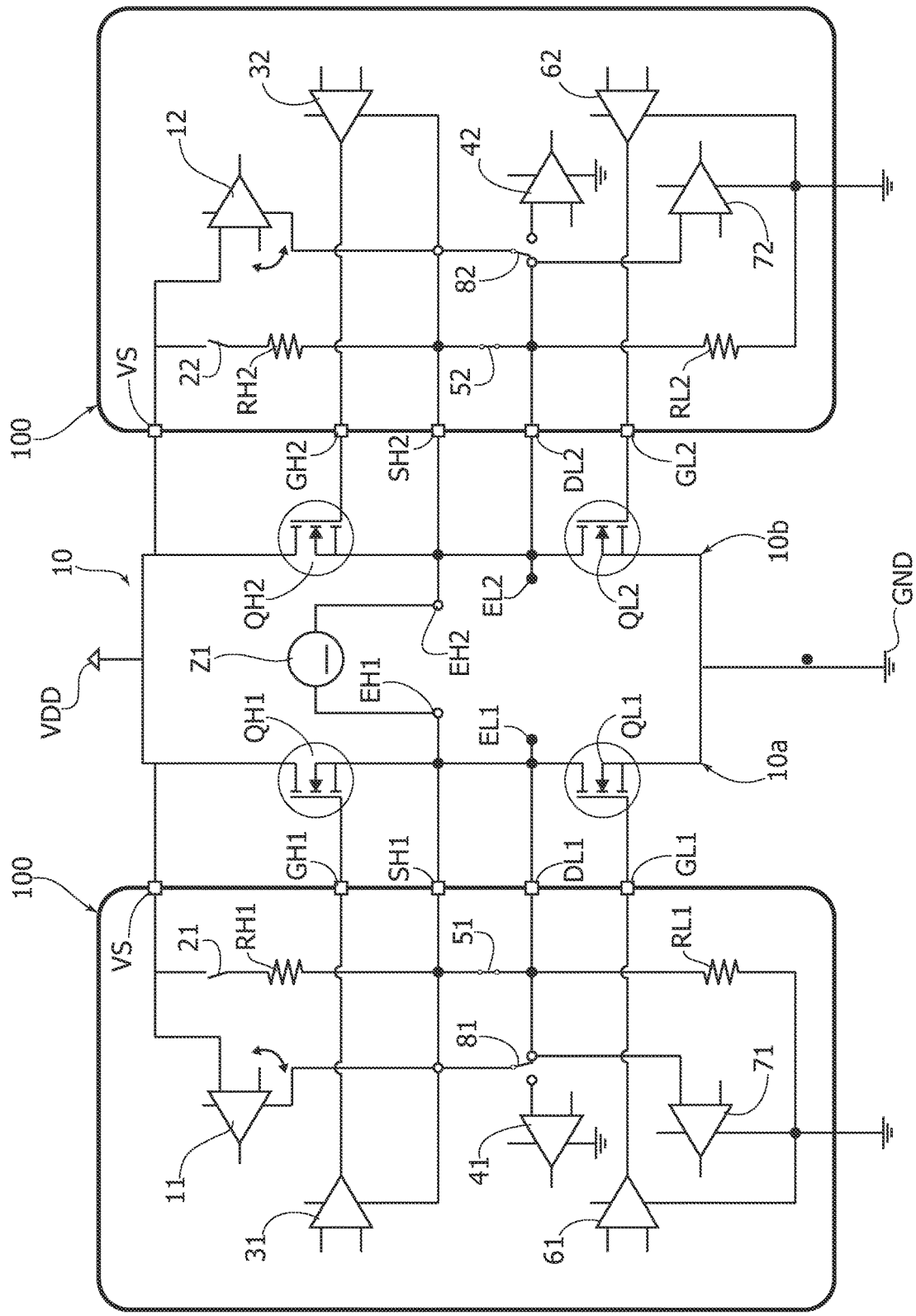

FIG. 4 is an exemplary diagram of a possible use of the H-bridge driver circuit 100 in a first operating mode to drive an inter-output-terminals load, e.g., a bidirectional electric moto Z1 for window lift in a vehicle.

In the example considered:
a first pair of switches 81, 82 may be in a first state, e.g., open, so as to couple the second pin DL1, DL2 with the supply node VS;
a second pair of switches 51, 52 may be in a second state, e.g., closed, so as to couple the first pin SH1 with the second pin DL1 (and pin SH1 with pin DL2).

In one or more embodiments, the bridge can be driven in half bridge mode (dual mode) for two separated motors, in a way per se known, for instance by setting a dual mode bit DM=1 in a dedicated logic circuit block control or status register, as discussed in the following.

Figure 5:
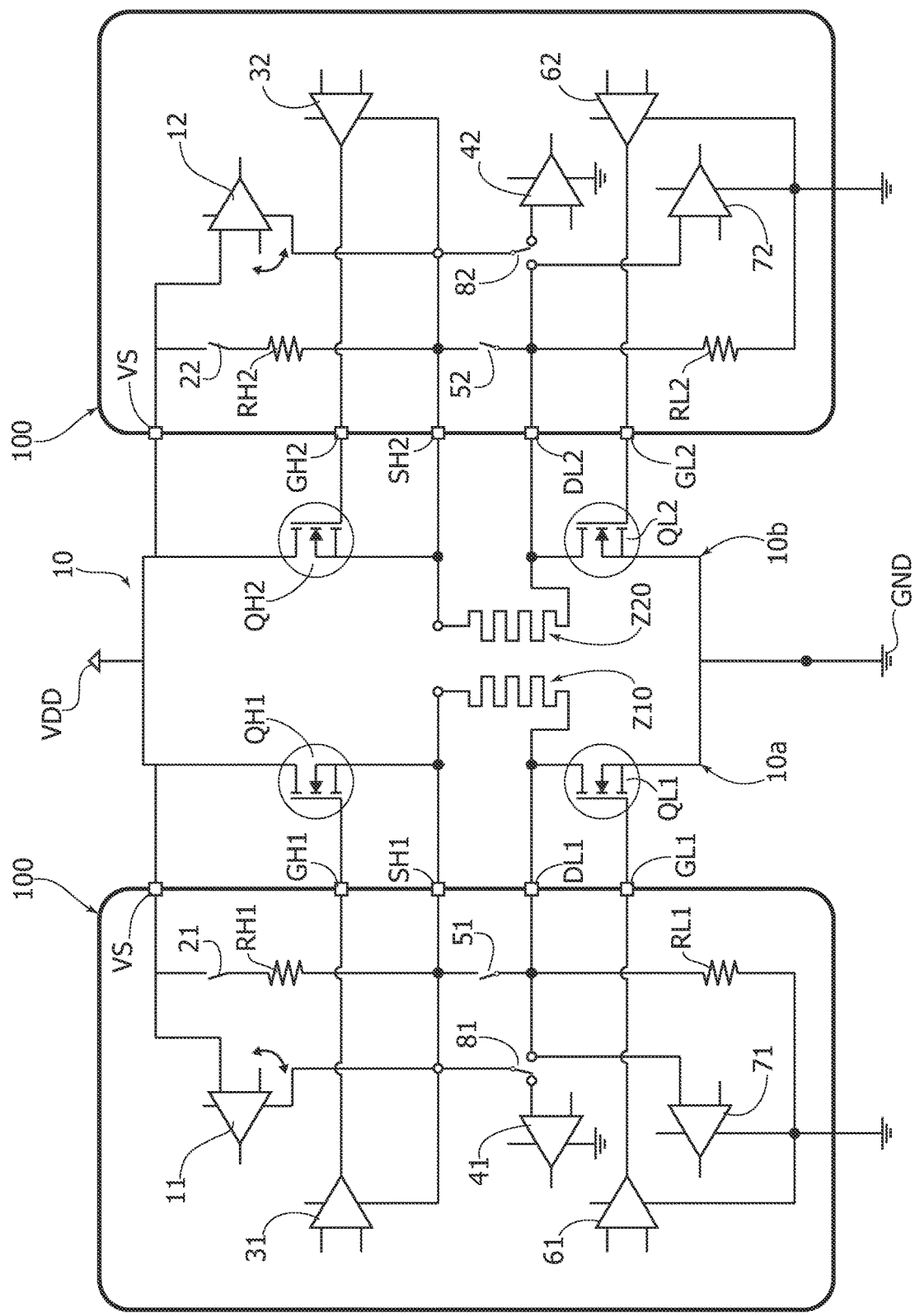
Figure 6:
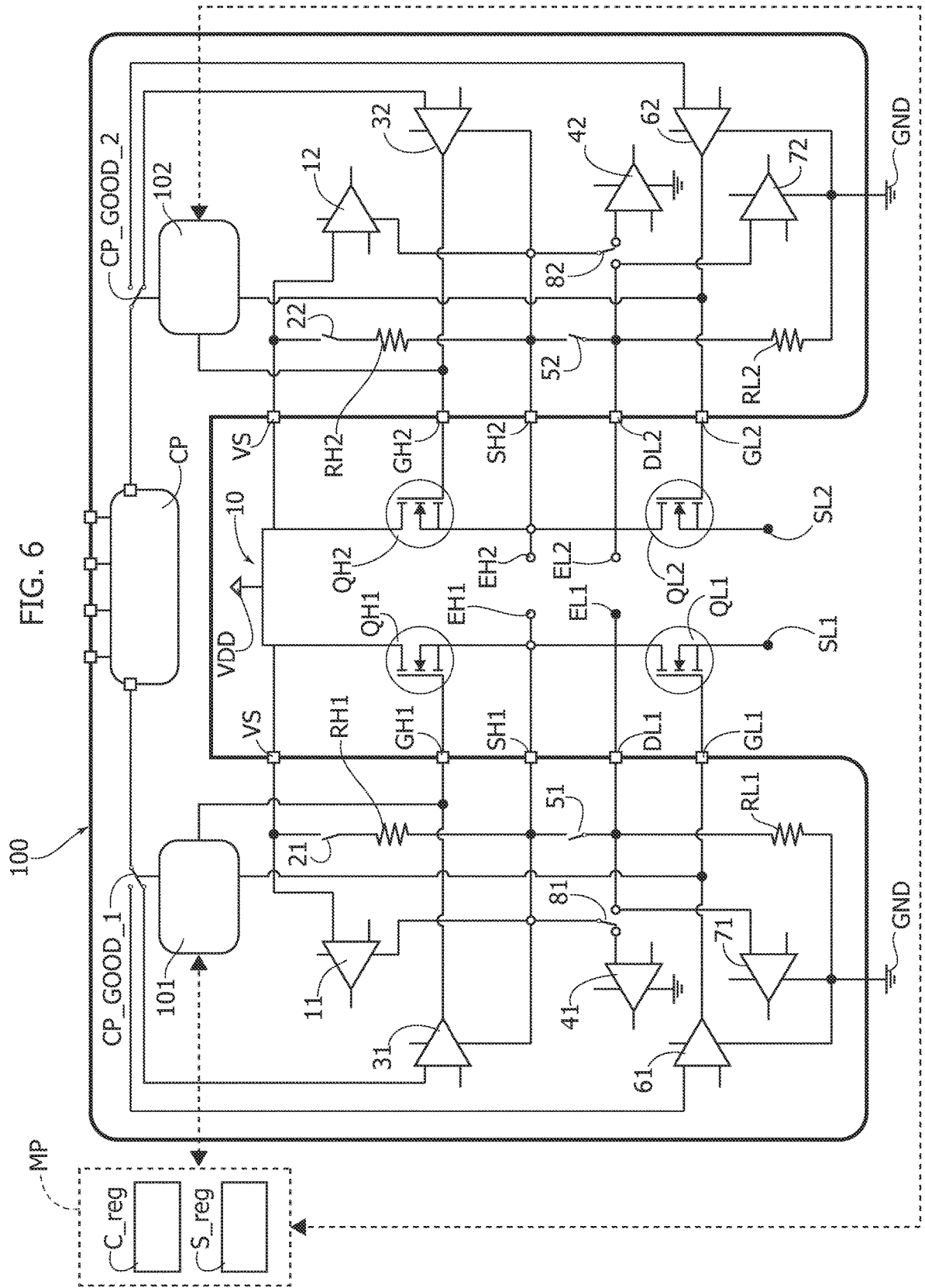
FIGS. 6 and 7 are diagrams exemplary of one or more embodiments of an application of the method for driving an H-bridge circuit.

FIG. 5 is an exemplary diagram of a possible use of the driver circuit portions 101, 102 of the driver circuit 100 to provide current to two loads, e.g., two heater impedances Z1, Z2 for a seat module in a vehicle.

In the example considered:
the first pair of switches 81, 82 may be in a second state, e.g., "closed", in order to couple the differential stage 41 to the supply node VS, and
the second pair of switches 51, 52 may be in a first state, e.g., "open", so as to decouple the first load node DL1 from the second load node SH1 (and decouple node DL2 from node SH2).

As exemplified in FIG. 5:
a first Z10 inter-output-nodes load may be coupled between the first pin SH1 and ground GND or between the first pin SH1 and second pin DL1,
a second Z20 inter-output-nodes load may be coupled between the third pin SH2 and ground GND or between the third pin SH2 and the fourth pin DL2, In one or more embodiments, hence, high side transistors can drive heating applications (while low side transistors could ground the heaters or be left "floating").

Figure 7:
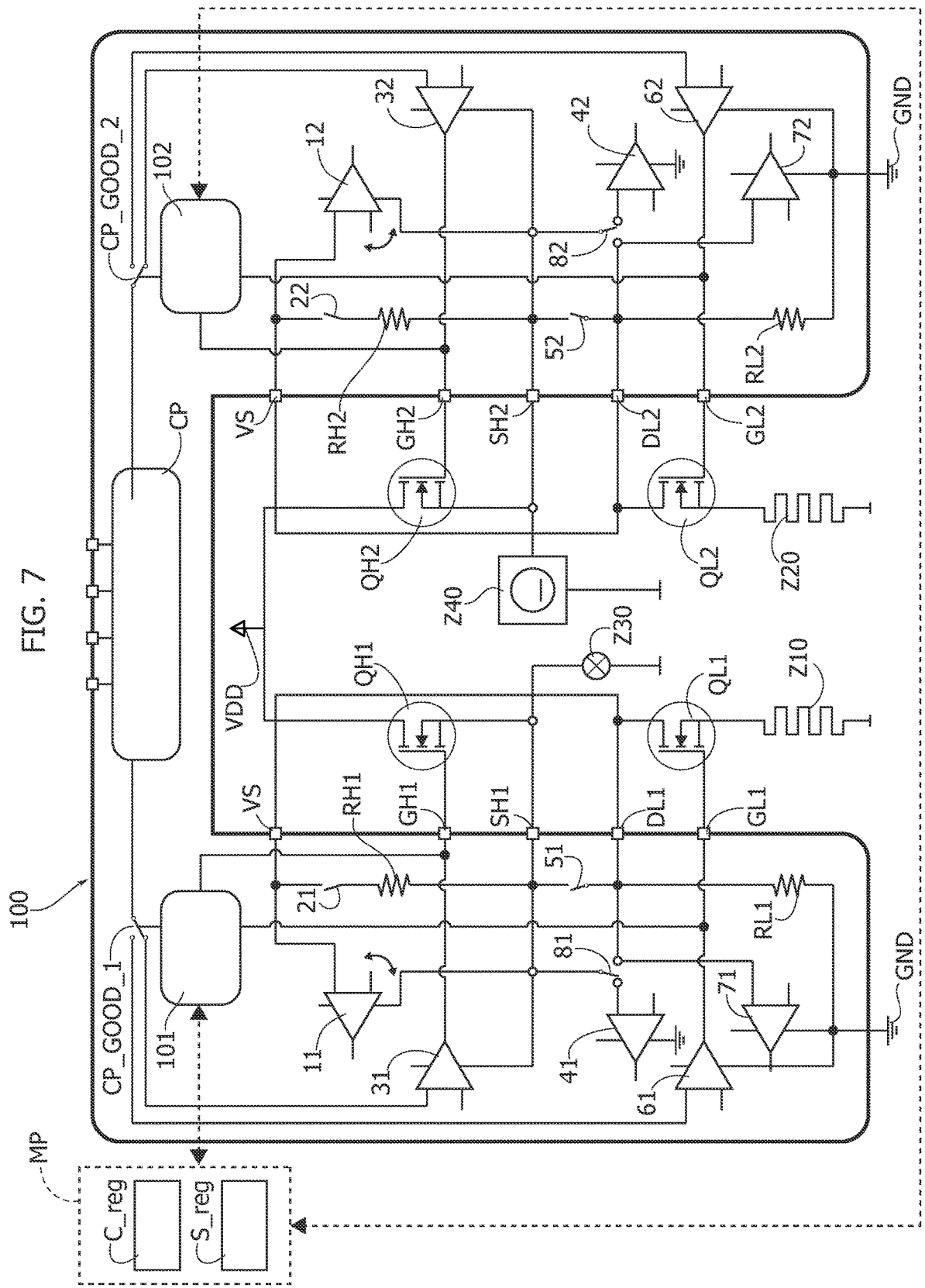

In one or more embodiments as exemplified in FIG. 7, to make the IP even more flexible there is the possibility to have up to all four transistors QH1, QL1, QH2, QL2 operating as "high side" drivers.

In this particular case, to have a full diagnosis, it could be necessary to include one additional pair of operational amplifiers (briefly, opamps) for drain-source monitoring of lower devices. In fact, due to this configuration, operational amplifier (briefly, opamp) 71 and 72 cannot perform both open load and drain-source diagnosis (see, e.g., FIG. 8)

In one or more embodiments, e.g., in cost/size optimized solutions, like for Application Specific Standard Product (ASSPs), where a low power single stage Charge Pump CP is adopted, a solution is provided to deal with CP current capability.

In one or more embodiments, also the third QL1 and fourth QL2 transistor may be driven as "high side" transistors, alternating sequentially (not simultaneously) to the other two transistors QH1, QH2.

Such an arrangement, as discussed in the following, may advantageously facilitate avoiding modification in the charge-pump CP fan-out while facilitating a "four high side" H-bridge arrangement to be flexibly adopted.

In one or more embodiments, the driver circuit may comprise respective control logic blocks 101, 102.

In one or more embodiments of the driver 100, a further pair of switches CP_good1, CP_good2 may selectively couple the charge pump CP to either the first transistors in respective pairs of transistors, e.g., the "high side" transistors QH1, QH2, or to second transistors in respective pair of transistors, e.g., the "low side" transistors QL1, QL2.

In one or more embodiments, respective control logic portions 101, 102 in the driver 100 may operate, cooperatively, in order to provide that solely such pairing of transistors QH1, QH2 or QL1, QL2 may be simultaneously operated to provide current to a set of loads.

In the following, drain terminal of low-side transistors are indicated as auxiliary load nodes SL1 and SL2, respectively, and may be "floating" instead of being coupled to ground GND.

In the example considered, for instance:
low-side transistors QL1, QL2 may be operated to provide a current to a load coupled to SL1, SL2 drain terminal nodes only if switches CP_GOOD_1, CP_GOOD_2 are in a first state, e.g., only if switches CP_GOOD_1, CP_GOOD_2 are "closed";

high side transistors QH1, QH2 may be operated to provide a current to a load coupled to third and fourth nodes DL1, DL2 only if switches CP_GOOD_1, CP_GOOD_2 are in a second state, e.g., only if CP_GOOD_1 and CP_GOOD_2 are "open".

In one or more embodiments, switches CP_GOOD_1 and CP_GOOD_2 may be operated via a respective signal "CP_GOOD".

In one or more embodiments, thanks to the solution discussed herein, CP fan-out may be kept while facilitating driving up to four transistors to provide a current to a load.

FIG. 7 is a diagram exemplary of an employ of the driver circuit D to provide current to four loads: for instance, a blower motor Z40; a defogger Z30, a pair of heater impedances Z10, Z20. Such an arrangement of loads Z10, Z20, Z30, Z40 may be advantageously used, for instance, in a Body Control Module for automotive applications.

Control logic portions 101, 102 may control the pairs of switches 21, 22; 51, 52; 81, 82 in the driver 100 thanks to signals issued on respective lines and whose values may be stored in dedicated registers C_reg, S_reg coupled to the control logic portions 101, 102. For instance:

a control register C_reg may store binary data comprising information on how to vary the state (e.g., open/closed) of switches in the set of switch pairs 21, 22; 81, 82; 51, 52; CP_GOOD_1, CP_GOOD_2 of the driver 100;

a status register S_reg may store binary data comprising information on a current status (e.g., open/closed) of switches in the set of switch pairs 21, 22; 81, 82; 51, 52; CP_GOOD_1, CP_GOOD_2 in the driver 100.

In one or more embodiments, a microcontroller MP may host software code portions to provide, e.g., through SPI communication, data to such registers and may provide the binary data therein to the driver control logic portions 101, 102.

In one or more embodiments, control register C_reg and status register S_reg may have a given number of bits, e.g., 24 bits. Values of such bits may be assigned to have a determined binary value as a function of a switch state to activate, e.g., if the 22th bit has a value "0" a switch is activated to be "open".

In the following, a table summarizes which bits (indicating them with references, e.g., QM, QMDIR) may be provided or added to Control Register C_reg in order to activate a first, second or third mode, e.g., "quad mode", or, e.g., to configure direct driving for existing pins DIRH and PWMH. Other bits could also be added for independent drain-source monitoring of transistors.

For instance, when the 20th bit in the register in the control register, indicated as QM, has a first value, then the H-Bridge driver may be operated to drive four loads with two charge pumps. For instance, a default value of bit QM may be "0", while when set to value of "1" the bit may enable driving four loads.

Table I below shows exemplary of values of Most Significant Bits (MSB) in the control register for setting one mode of the H-bridge driver.

TABLE I

Control Register CRxx MSB

| Bit 23 (MSB) 0 (R) | Bit 22 0 (R/W) | Bit 21 0 (R/W) | Bit 20 0 (R/W) | Bit 19 1 (R/W) | Bit 18 1 (R/W) | Bit 17 1 (R/W) | Bit 16 0 (R/W) |
|---|---|---|---|---|---|---|---|
| ... ... | ... ... | ... ... | QM H-Bridge Quad mode | QMDIR_2 Quad mode Direct drive pin configuration Bit 2 | QMDIR_1 Quad mode Direct drive pin configuration Bit 1 | QMDIR_0 Quad mode Direct drive pin configuration Bit 0 | QMPLUS All transistors driven as HS |

In one or more embodiments, a 19th bit in the control register C_reg, indicated as QMDIR_2, may—as well as bits indicated as QMDIR_1, QMDIR_0—be configured to select driving configuration. Specifically, in one or more embodiments bits indicated as QMDIR_2, QMDIR_1 and QMDIR_0 setting may facilitate selecting which input pin in a pair of input pins DIRH, PWMH may actually be used to drive, e.g., directly, any transistor in set of transistors QH1, QH2, QL1 or QL2. For instance, as indicated in the following table:

In one or more embodiments, an operation mode, e.g., the one in the last row of Table II, may be set as default operation mode.

Table II below is exemplary of possible selection of input pins to drive any transistor in set of transistors QH1, QH2, QL1 or QL2.

TABLE II

| 0 | 0 | 0 | DIRH drives QH1, PWMH QL1 |
| 0 | 0 | 1 | DIRH drives QH1, PWMH QL2 |
| 0 | 1 | 0 | DIRH drives QH1, PWMH QH2 |
| 0 | 1 | 1 | DIRH drives QL1, PWMH QL2 |
| 1 | 0 | 0 | DIRH drives QL1, PWMH QH2 |
| 1 | 0 | 1 | DIRH drives QL2, PWMH QH2 |
| 1 | 1 | 0 | DIRH drives QH1 & QL1, PWMH QH2 & QL2 |
| 1 | 1 | 1 | DIRH drives both QH1, QH2, PWMH both QL1, QL2 |

It is noted that these configurations may be valid if a bit QM has a first value, e.g., QM="1". In other cases, pins follow "single" or "dual" mode behavior as a function of selected operation mode.

In one or more embodiments, the bit indicated as QMPLUS may facilitate operating all MOSFETS in the H-bridge 10 as high side transistors. For instance, when QM has a first value, e.g., QM="0", then the third operation mode is disabled while if QM has a second value, e.g., QM="1", the third operation mode is enabled.

Moreover, as mentioned in the foregoing, also a status register S_reg may be updated in order to facilitate control by the control logic portions 101, 102. For instance, a couple of bits CP_GOOD_1, CP_GOOD_2 in order to flag that among high side transistors GH1, GH1 gate voltage is sufficiently high and that the charge pump CP is ready to provide the needed gate voltage also to low side transistors GL1, GL2.

Table III below shows a summary of values of status register bits and, in particular, Status Register (SR) Least Significant Bits (LSB) values.

TABLE III

Status Register SRxx LSB

| Bit 7 Read & Clear | Bit 6 Read & Clear | Bit 5 Read & Clear | Bit 4 Read & Clear | Bit 3 Read & Clear | Bit 2 Read & Clear | Bit 1 Read & Clear | Bit 0 Read & Clear |
|---|---|---|---|---|---|---|---|
| ... ... | ... ... | CP_GOOD_1 Charge pump ready for HS3 quad mode+ | CP_GOOD_2 Charge pump ready for HS4 quad mode+ | ... ... | ... ... | ... ... | ... ... |

Figure 8:
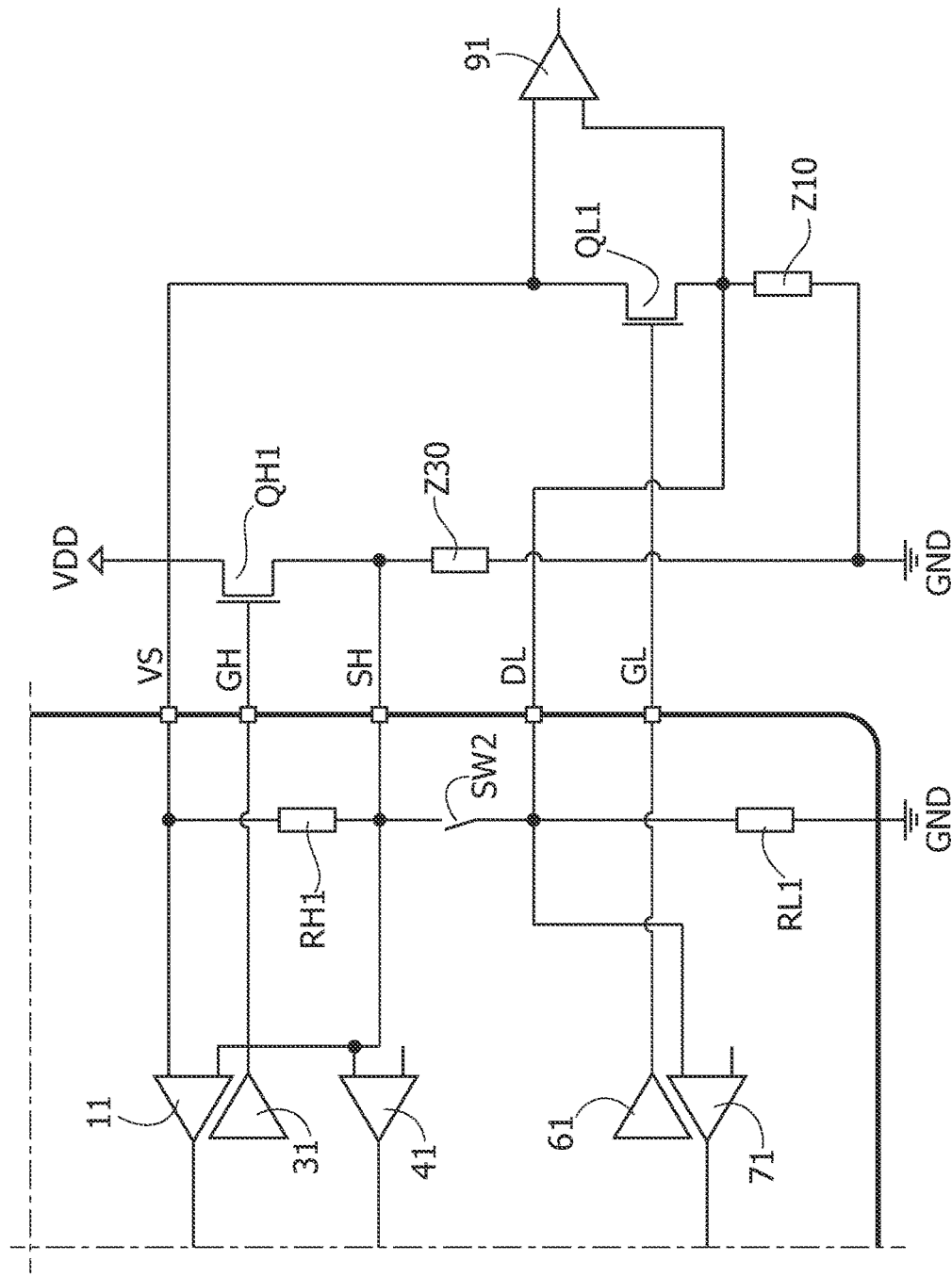
FIG. 8 is a diagram exemplary of a portion of FIG. 7.

As exemplified in FIG. 8, representing a portion of FIG. 7, specifically a left-side portion of the "four high-sides" arrangement of FIG. 7, one or more embodiments may comprise a dedicated op-amp 91 coupled between drain and source of, e.g., transistor QL1 on the left side, so as to facilitate drain-source monitoring, e.g., to detect possible short circuit conditions to ground GND. Specifically, such op-amp 91 may be useful to detect such condition during the ON state of the transistor QL1.

A method according to one or more embodiments may comprise:
 a) providing a H-bridge circuit including a supply node configured to be coupled to a supply voltage (for instance, VDD) as well as a first pair of transistors (for instance, QH1, QL1) and a second pair of transistors (for instance, QH2, QL2), each pair of transistors including a first transistor (for instance, QH1; QH2) and a second transistor (for instance, QL1; QL2), wherein:
  the first transistors in the two pairs of transistors may have the current paths therethrough included in respective current flow lines between the supply node and a first output node (for instance, EH1) and between the supply node and a second output node (for instance, EH2), respectively, and
  the second transistors in the two pairs of transistors may have the current paths therethrough coupled to a third output node (for instance EL1) and a fourth output node (for instance EL2), respectively, the first output node and the third output node mutually isolated from each other and the second output node and the fourth output node mutually isolated from each other, b) operating said H-bridge circuit in a selected one of a plurality of modes, the plurality of modes comprising a first, a second and a third mode, wherein:

i) in the first mode:

the first output node is shorted to the third output node to provide a first output terminal (EH1, EL1) and the second output node is shorted to the fourth output node to provide a second output terminal, the second transistors in the two pairs of transistors are arranged with the current paths therethrough coupled between the first output terminal and the second output terminal respectively, and ground (for instance GND), an inter-output-terminal electrical load (for instance Z1) is couplable between the first output terminal (for instance EH1, EL1) and the second output terminal (for instance EL1, EL2), with the inter-output-terminal electrical load configured to be traversed by currents flowing therethrough in opposite directions as a result of the first transistor (for instance QH1) in the first pair of transistors and the second transistor (for instance QL2) in the second pair of transistors and the first transistor (for instance QH2) in the second pair of transistors and the second transistor (for instance QL1) in the first pair of transistors being made conductive, respectively;

ii) in the second mode:

the second transistors (for instance QL1, QL2) in the two pairs of transistors are arranged with the current paths therethrough coupled between the third output node and ground and between the fourth output node and ground, respectively, a first inter-output-node electrical load (for instance Z10) and a second inter-output-node electrical load (for instance Z20) are couplable between the first output node (for instance EH1) and the third output node (for instance EL2) and between the second output node (for instance EH2) and the fourth output node (for instance EL2), respectively, with the first inter-output-node electrical load and the second inter-output-node electrical load configured to be electrically supplied as a result of the first transistor and the second transistor in the first pair of transistors being made conductive and the first transistor and the second transistor in the second pair of transistors being made conductive, respectively;

iii) in the third mode:

the third output node and the fourth output node are couplable to a respective supply voltage (for instance VS), the second transistors in the two pairs of transistors are arranged with the current paths therethrough couplable to respective ground-referred loads (for instance Z10, Z20) referred to ground (for instance GND) opposite said third output node (for instance EL1) and said fourth output node (for instance EL2), with said respective ground-referred loads (for instance Z20) configured to be electrically supplied as a result of the second transistor in the first pair of transistors and the second transistor in the second pair of transistors being made conductive, a first output-node load (for instance Z30) is couplable to said first output node (for instance EH1), with said first output load configured to be electrically supplied as a result of the first transistor in the first pair of transistors being made conductive;

a second output-node load (for instance Z40) is couplable to said second output node, with said second output-node load (for instance, Z40) configured to be electrically supplied as a result of the first transistor in the second pair of transistors being made conductive.

In one or more embodiments, the method may comprise:

providing a first pair (for instance GH1, GL1) and a second pair (for instance GH2, GL2) of transistor drive pins configured to be coupled to respective control terminals of the first pair of transistors and the second pair of transistors in the H-bridge circuit;

providing a charge pump circuit (for instance, CP), configured to be coupled to said first pair and said second pair of transistor drive pins to supply electrical charge thereto.

In one or more embodiments, the method may comprise, in said third mode, either one of:

coupling the charge pump circuit (for instance, CP) to the transistor drive pins (for instance, GH1, GH2) configured to be coupled to the control terminals of the first transistors in the first pair of transistors and in the second pair of transistors, and keeping the charge pump circuit decoupled from the transistor drive pins configured to be coupled to the control terminals of the second transistors in the first pair of transistors and in the second pair of transistors, and keeping the charge pump circuit decoupled from the transistor drive pins configured to be coupled to the control terminals of the first transistors in the first pair of transistors and in the second pair of transistors, and coupling the charge pump circuit to the transistor drive pins configured to be coupled to the control terminals of the second transistors in the first pair of transistors and in the second pair of transistors.

One or more embodiments may comprise an H-bridge circuit driver device, configured to drive with the method of any of the previous claims an H-bridge circuit including a supply node configured to be coupled to a supply voltage (for instance, VDD) as well as a first pair of transistors (for instance, QH1, QL1) and a second pair of transistors (for instance, QH2, QL2), each pair of transistors including a first transistor (for instance, QH1; QH2) and a second transistor (for instance, QL1, QL2), wherein the first transistors (for instance, QH1; QH2) in the two pairs of transistors (for instance, QH1, QL1; QH2, QL2) have the current paths therethrough included in respective current flow lines between the supply node (for instance, VDD) and a first output node (for instance, EH1) and between the supply node (for instance, VDD) and a second output node (for instance, EH2), respectively, and the second transistors in the two pairs of transistors have the current paths therethrough coupled to a third output node (for instance, EL1) and a fourth output node (for instance, EL2), respectively, the first output node and the third output node mutually isolated from each other and the second output node and the fourth output node mutually isolated from each other.

In one or more embodiments of the driver device may comprise:

a first pair (for instance, GH1, GL1) and a second pair (for instance, GH2, GL2) of transistor drive pins configured to be coupled to respective control terminals of the first pair of transistors (for instance, QH1, QL1) and the second pair of transistors (for instance, QH2, QL2) in the H-bridge circuit;

first (for instance, SH1), second (for instance, SH2), third (for instance, DL1) and fourth (for instance, DL2)

output node pins configured to be coupled to the first, second, third and fourth output nodes, respectively;

at least one supply node pin (for instance, VS);

logic control circuitry (for instance, 101, 102) coupled to the first pair and second pair of transistor drive pins, the first, second, third and fourth output node pins and the at least one supply node pin (for instance, VS), the logic control circuitry (101, 102) configured to:

i) in said first mode:

short the first output node pin to the third output node pin and the second output node pin (for instance, SH2) to the fourth output node pin (for instance, DL2), activate the transistor drive pins (for instance, GH1, GL2) for the first transistor in the first pair of transistors and the second transistor in the second pair of transistors and the drive pins (for instance, GH2, GL2) for the first transistor in the second pair of transistors and the second transistor in the first pair of transistors, respectively, to make said transistors conductive, wherein said inter-output-terminal electrical load (for instance, Z1) is traversed by currents flowing therethrough;

ii) in said second mode:

activate the transistor drive pins (for instance, GH1, GL1) for the first transistor and the second transistor in the first pair of transistors and the transistor drive pins for the first transistor and the second transistor in the second pair of transistors respectively, to make said transistors conductive, wherein the first inter-output-node electrical load (for instance, Z10) and the second inter-output-node electrical load (for instance, Z20) are electrically supplied;

iii) in said third mode:

couple the third output node pin and the fourth output node pin to said respective supply voltage (for instance, VS), activate the transistor drive pins (for instance, GL1, GL2) for the second transistor in the first pair of transistors and the second transistor in the second pair of transistors to make said transistors conductive, wherein said respective ground-referred loads (for instance, Z20) are electrically supplied, activate the transistor drive pin (for instance, GH1) for the first transistor in the first pair of transistors to make said transistor conductive, wherein said first output load (for instance, Z30) is electrically supplied;

activate the transistor drive pin (for instance, GH2) for the first transistor in the second pair of transistors to make said transistor conductive, wherein said second output load (for instance, Z40) is electrically supplied.

In one or more embodiments, the H-bridge circuit driver device may comprise a charge pump circuit (for instance, CP), configured to be coupled to said first pair and said second pair of transistor drive pins to supply electrical charge thereto.

In one or more embodiments, the H-bridge circuit may comprise, in said third mode, either one of:

coupling the charge pump circuit to the transistor drive pins configured to be coupled to the control terminals of the first transistors in the first pair of transistors and in the second pair of transistors, and keeping the charge pump circuit decoupled from the transistor drive pins configured to be coupled to the control terminals of the second transistors in the first pair of transistors and in the second pair of transistors, and keeping the charge pump circuit decoupled from the transistor drive pins configured to be coupled to the control terminals of the first transistors in the first pair of transistors and in the second pair of transistors, and coupling the charge pump circuit to the transistor drive pins configured to be coupled to the control terminals of the second transistors in the first pair of transistors and in the second pair of transistors.

One or more embodiments of a system, may comprise:

one or more embodiments of the H-bridge circuit driver device, and a memory (for instance, MP), comprising a set of registers (for instance, S_reg, C_reg) wherein:

a) at least one register (for instance, C_reg) in the set of registers (for instance, S_reg, C_reg) may be configured to provide signals to said logic control circuitry (for instance, 101, 102) in said the H-bridge circuit driver device in order to operate said H-bridge circuit in a selected one of a plurality of modes, the plurality of modes comprising a first, a second and a third mode, and b) at least another register (for instance, S_reg) in the set of registers may be configured to store binary values indicative of selected one of a plurality of modes, the plurality of modes comprising a first, a second and a third mode to operated said the H-bridge circuit driver device.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

The claims are an integral part of the technical teaching provided herein with reference to the embodiments.

Without prejudice to the underlying principles, the details and embodiments may vary, even significantly, with respect to what has been described by way of example only, without departing from the extent of protection. The extent of protection is defined by the annexed claims.

The invention claimed is:

1. A method for driving an H-bridge circuit, wherein the H-bridge circuit comprises:

a supply node configured to be coupled to a supply voltage;

a first pair of transistors and a second pair of transistors, each pair of transistors including a first transistor and a second transistor;

wherein the first transistors in the first and second pairs of transistors have current paths between the supply node and a first output node and between the supply node and a second output node, respectively;

wherein the second transistors in the first and second pairs of transistors have current paths coupled to a third output node and a fourth output node, respectively;

wherein the first output node and the third output node are mutually isolated from each other; and wherein the second output node and the fourth output node are mutually isolated from each other;

the method comprising:

actuating a first switch to selectively electrically short the mutually isolated first output node and third output node to provide a first output terminal;

actuating a second switch to selectively electrically short the mutually isolated second output node and fourth output node to provide a second output terminal;

arranging the second transistors in the first and second pairs of transistors with the current paths therethrough coupled between the first output terminal and the second output terminal, respectively, and ground; and coupling an inter-output-terminal electrical load between the first output terminal and the second output terminal so that the inter-output-terminal electrical load is traversed by currents flowing therethrough in opposite directions as a result of the first transistor in the first pair of transistors and the second transistor in the second pair of transistors and the first transistor in the second pair of transistors and the second transistor in the first pair of transistors being made conductive, respectively.

2. The method of claim 1, further comprising:
coupling a first pair of transistor drive pins to respective control terminals of the first pair of transistors;
coupling a second pair of transistor drive pins to respective control terminals of the second pair of transistors; and
coupling a charge pump circuit to said first pair and said second pair of transistor drive pins to supply electrical charge thereto.

3. A method for driving an H-bridge circuit, wherein the H-bridge circuit comprises:
a supply node configured to be coupled to a supply voltage;
a first pair of transistors and a second pair of transistors, each pair of transistors including a first transistor and a second transistor;
wherein the first transistors in the first and second pairs of transistors have current paths between the supply node and a first output node and between the supply node and a second output node, respectively;
wherein the second transistors in the first and second pairs of transistors have current paths coupled to a third output node and a fourth output node, respectively;
wherein the first output node and the third output node are mutually isolated from each other; and
wherein the second output node and the fourth output node are mutually isolated from each other;
the method comprising:
arranging the second transistors in the first and second pairs of transistors with the current paths therethrough coupled between the third output node and ground and between the fourth output node and ground, respectively;
coupling a first inter-output-node electrical load and a second inter-output-node electrical load between the first output node and the third output node and between the second output node and the fourth output node, respectively, with the first inter-output-node electrical load and the second inter-output-node electrical load configured to be electrically supplied as a result of the first transistor and the second transistor in the first pair of transistors being made conductive and the first transistor and the second transistor in the second pair of transistors being made conductive, respectively.

4. The method of claim 3, further comprising:
coupling a first pair of transistor drive pins to respective control terminals of the first pair of transistors;
coupling a second pair of transistor drive pins to respective control terminals of the second pair of transistors; and
coupling a charge pump circuit to said first pair and said second pair of transistor drive pins to supply electrical charge thereto.

5. A method for driving an H-bridge circuit, wherein the H-bridge circuit comprises:
a supply node configured to be coupled to a supply voltage;
a first pair of transistors and a second pair of transistors, each pair of transistors including a first transistor and a second transistor;
wherein the first transistors in the first and second pairs of transistors have current paths between the supply node and a first output node and between the supply node and a second output node, respectively;
wherein the second transistors in the first and second pairs of transistors have current paths coupled to a third output node and a fourth output node, respectively;
wherein the first output node and the third output node are mutually isolated from each other; and
wherein the second output node and the fourth output node are mutually isolated from each other;
the method comprising:
coupling the third output node and the fourth output node to a respective supply voltage;
arranging the second transistors in the first and second pairs of transistors with the current paths therethrough coupled to respective ground-referred loads referred to ground opposite said third output node and said fourth output node, with said respective ground-referred loads configured to be electrically supplied as a result of the second transistor in the first pair of transistors and the second transistor in the second pair of transistors being made conductive;
coupling a first output-node load to said first output node, with said first output load configured to be electrically supplied as a result of the first transistor in the first pair of transistors being made conductive; and
coupling a second output-node load to said second output node, with said second output-node load configured to be electrically supplied as a result of the first transistor in the second pair of transistors being made conductive.

6. The method of claim 5, further comprising:
coupling a first pair of transistor drive pins to respective control terminals of the first pair of transistors;
coupling a second pair of transistor drive pins to respective control terminals of the second pair of transistors; and
selectively coupling a charge pump circuit to said first pair and said second pair of transistor drive pins to supply electrical charge thereto.

7. The method of claim 6, wherein selectively coupling comprises coupling the charge pump circuit to the transistor drive pins configured to be coupled to the control terminals of the first transistors in the first pair of transistors and in the second pair of transistors, and decoupling the charge pump circuit from the transistor drive pins configured to be coupled to the control terminals of the second transistors in the first pair of transistors and in the second pair of transistors.

8. The method of claim 6, wherein selectively coupling comprises decoupling the charge pump circuit from the transistor drive pins configured to be coupled to the control terminals of the first transistors in the first pair of transistors and in the second pair of transistors, and coupling the charge pump circuit to the transistor drive pins configured to be coupled to the control terminals of the second transistors in the first pair of transistors and in the second pair of transistors.

* * * * *

UNITED STATES PATENT AND TRADEMARK OFFICE
CERTIFICATE OF CORRECTION

| | |
|---|---|
| PATENT NO. | : 11,342,908 B2 |
| APPLICATION NO. | : 17/145863 |
| DATED | : May 24, 2022 |
| INVENTOR(S) | : Giovanni Luca Torrisi et al. |

It is certified that error appears in the above-identified patent and that said Letters Patent is hereby corrected as shown below:

On the Title Page

(30) Foreign Application Priority Data should read:
Apr. 18, 2019 (IT) .................... 102019000006078

Signed and Sealed this
Fifteenth Day of November, 2022

Katherine Kelly Vidal
*Director of the United States Patent and Trademark Office*